United States Patent [19]

Fuller et al.

[11] Patent Number: 4,847,522
[45] Date of Patent: Jul. 11, 1989

[54] CMOS AMPLIFIER/DRIVER STAGE WITH OUTPUT DISABLE FEATURE

[75] Inventors: Roger W. Fuller, Scotts Valley; David Bingham, San Jose, both of Calif.

[73] Assignee: Maxim Integrated Products, Sunnyvale, Calif.

[21] Appl. No.: 204,215

[22] Filed: Jun. 8, 1988

[51] Int. Cl.$^4$ ............... H03K 19/01; H03K 19/003; H03K 19/092; H03K 19/094

[52] U.S. Cl. ............... 307/473; 307/446; 307/570; 307/475

[58] Field of Search ............... 307/446, 570, 473, 443, 307/264, 475, 270, 450, 451, 571, 482.1, 303, 303.2; 323/315, 316, 317

[56] References Cited

U.S. PATENT DOCUMENTS

| | | | |
|---|---|---|---|
| 4,703,203 | 10/1987 | Gallup et al. | 307/473 X |
| 4,739,198 | 4/1988 | Marayama | 307/473 X |
| 4,800,294 | 1/1989 | Taylor | 307/473 X |
| 4,801,825 | 1/1989 | Stanley et al. | 307/473 |

Primary Examiner—John S. Heyman
Assistant Examiner—David R. Bertelson
Attorney, Agent, or Firm—Blakely, Sokoloff, Taylor & Zafman

[57] ABSTRACT

The invention relates to an output circuit capable of producing an output signal which may be disabled, leaving the output terminal in a high impedance state capable of being driven externally to a voltage significantly outside the bounds of the output circuit power supply. The output circuit of the invention includes two terminals adapted to be connected to a power supply capable of providing a supply voltage. The output circuit includes an MOS transistor having a substrate, source and drain terminals and a gate, one of the source and drain terminals being coupled to one of the power supply terminals. A second transistor has three terminals including a control terminal and two other terminals, one of which is coupled to the other of the source and drain terminals of the MOS transistor, and the other of which is coupled to the other power supply terminal. An output terminal is coupled between the one terminal of the second transistor and the other of the source and drain terminals of the MOS transistor. A means responsive to an external signal is provided for rendering the output terminal in a high impedance state. A substrate control circuit coupled to the substrate, source and drain terminals of the MOS transistor has a means (1) for detecting whether the voltage at the output terminal is within the voltage range of the power supply, and (2) for controlling the voltage on the substrate of the MOS transistor such that neither its source-substrate nor its drain-substrate junctions can become forward biased, while at the same time providing a voltage capable of disabling both the bipolar and the MOS transistors upon receipt of the external signal. This circuit, unlike prior art circuits, allows the output terminal to be driven significantly beyond the limits of the voltages at the terminals of the power supply, thus permitting its use in "wired-or" configurations which are important where line driver outputs are used, allowing operation with multiple power supplies having differing voltages, or with no power supply at all.

14 Claims, 7 Drawing Sheets

CMOS AMPLIFIER/DRIVER STAGE WITH OUTPUT DISABLE FEATURE

BACKGROUND OF THE INVENTION

1. Field Of The Invention

The present invention relates to integrated circuit technology, more particularly, to amplifier/driver circuits using CMOS technology whose outputs may be placed in a floating or high impedance state.

2. The Prior Art

In many applications, it is desirable or necessary to disable the output stage of an amplifier, line driver, or logic gate, leaving the output in a high inpedance state. The output may then be driven by another source.

With conventional junction-isolated CMOS circuits, the implementation of such so-called "three-state" outputs is common and may be straightforwardly implemented, with the restriction that the output node or terminal cannot be driven more than a diode-drop voltage above the positive supply voltage or below the negative supply voltage. If either of these conditions occurs with conventional three-state circuits using junction-isolated CMOS technology, the parasitic PN diodes inherent in CMOS devices become forward biased and act to clamp the output to the power supply voltage. Under these conditions, the current flowing through these parasitic diodes can easily be enough to destroy them and the CMOS circuit with which they are associated. In addition, the forward biasing of these parasitic diodes also injects minority carriers into the semiconductor substrate. These minority carriers can trigger the well-known latch-up phenomenon, a common potential problem in CMOS technology.

There are applications which require of the CMOS three-state output circuit the ability to be driven beyond the voltage levels of the power supply which maintains the high impedance at the output. There is thus a need for a circuit which can withstand such conditions without forward biasing any CMOS PN junctions in the output circuit. This is especially important in applications where line driver outputs are used in a "wired-or" configuration with other drivers which may be operating with different power supply voltages and/or no power supplies.

BRIEF DESCRIPTION OF THE INVENTION

Briefly, the invention relates to a CMOS output circuit capable of producing an output signal which may be disabled. When disabled, the output terminal of the circuit is left in a high impedance state so that it may be driven externally to voltages significantly outside the bounds of its power supply. Prior art CMOS output circuits may not be driven externally to a voltage which exceeds that of either of the power supply terminals by more than a diode drop. With the circuit of the invention, the output terminal voltage may exceed the power supply voltages significantly.

The circuit of the invention includes two terminals adapted to be connected to a power supply capable of providing a supply voltage. For CMOS, typically such supply voltages are 0 and 5 volts, ±5 volts, ±12 volts or ±15 volts. The output circuit includes an MOS transistor having a substrate, a source terminal, a drain terminal and a gate. Either the source or the drain terminal is coupled to one of the power supply terminals. The circuit also includes a second transistor having a control terminal and two other terminals. This second transistor can be a bipolar transistor having a base as its control terminal and an emitter and a collector as the other two terminals. The emitter is coupled to the other of the course and drain terminals of the MOS transistor. The collector is coupled to the other power supply terminal.

The output terminal of the circuit of this invention is connected between one of the other terminals of the second transistor, for example, the emitter of the bipolar transistor, and the terminal of the source and drain terminals of the MOS transistor which is not connected to the power supply. The circuit includes a means responsive to an external signal for rendering the output terminal in a high impedance state.

Essential to the invention is a substrate control circuit coupled to the substrate, source and drain terminals of a first MOS transistor. If the second transistor is also MOS, a second substrate control circuit is coupled to it in the same manner as to the first MOS transistor. The substrate control circuit has a means for (1) detecting whether the voltage at the output terminal is within the voltage range of the power supply and (2) for controlling the voltage on the substrate of the MOS transistor such that neither its source-substrate nor its drain-substrate junctions can become forward biased. At the same time, this substrate control circuit provides a voltage capable of disabling the first MOS transistor upon receipt of the external signal by connecting its gate to its substrate. Preferably, upon receipt of this external signal, the substrate control circuit provides a voltage which also disables the second transistor and the first MOS transistor.

In another preferred embodiment of the invention, instead of a single MOS transistor, a two-MOS cascode circuit is used for systems having higher supply voltage values, for example above about 16 volts for standard P-well junction-isolated CMOS. The cascode arrangement is particularly useful when the supply voltage is greater than the "LVCEO breakdown" voltage of the parasitic NPN transistor associated with each N-channel transistor. The drain of the first MOS transistor is connected to the source of the MOS cascode transistor. The other of the source and drain terminals of the MOS cascode transistor is connected to the emitter of the bipolar transistor and also to the output terminal. The substrate control circuit is coupled to the substrate, source and drain terminals of the MOS cascode transistor, and operates in the same manner to control the MOS cascode transistor, and to disable the MOS cascode transistor and preferably also the bipolar transistor upon receipt of the external signal.

The circuits of this invention, unlike prior art circuits, allow the output terminals to be driven significantly beyond the limits of the voltages on the terminals of the power supply. This allows the use of the circuit of this invention in a "wired-or" configuration which is important where line driver outputs are used, allowing operation with multiple power supplies having differing voltages, or with no power supply at all.

DETAILED DESCRIPTION OF A PREFERRED EMBODIMENT

Figure 1:
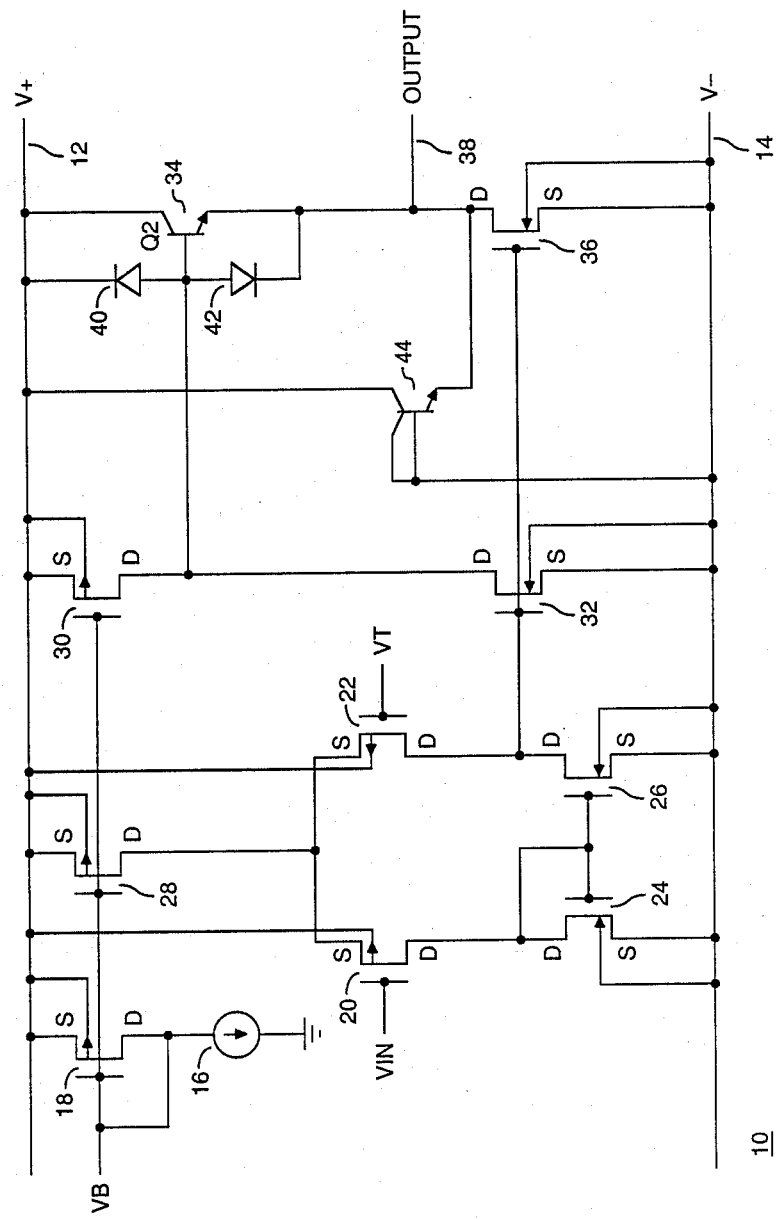
FIG. 1 is a basic P-well, junction-isolated CMOS operational amplifier/driver circuit illustrating an environment in which the present invention may be useful.

The environment of the present invention includes an operational amplifier/driver circuit as depicted in FIG. 1. The operational amplifier/driver circuit 10 of FIG. 1 is driven from a positive voltage rail 12 and a negative voltage rail 14. Either of these two supply voltages could have a value of zero volts. A current source 16 is connected to both the drain and gate of a P-channel MOS transistor 18, having its source connected to positive voltage rail 12. Current source 16 may be one of many well known integratable current sources. A bias voltage VB is established on the gate of diode-connected MOS transistor 18 by the use of this current source and is used to set the bias current levels for the rest of the circuit.

The environment also includes a differential input circuit having a differential pair of P-channel MOS transistors 20 and 22, driving N-channel load transistors 24 and 26, and a current source comprising P-channel MOS transistor 28. P-channel current source transistor 28 has its source connected to positive voltage rail 12, its gate connected to VB and its drain connected to the sources of MOS transistors 20 and 22. The drain of transistor 20 20 is connected to the drain and gate of transistor 24, whose source and substrate are connected to negative voltage rail 14. The drain of P-channel transistor 22 is connected to the drain of transistor 26. The gate of transistor 26 is connected to the gate of transistor 24. The source and substrate of transistor 26 are connected to negative voltage rail 24. Transistors 24 and 26 are configured as conventional load devices.

The output of this differential input circuit is taken from the drain of transistor 22. P-channel current source transistor 30 and N-channel transistor 32 form the base driver stage of operational amplifier/driver circuit 10. Like current source transistor 28, current source transistor 30 has its source connected to positive voltage rail 12 and its gate connected to VB. The sizing of current source transistors such as transistor 28 and 30 will determine the current that these devices will source for a given value of VB. The drain of current source transistor 30 is connected to the drain of base driver transistor 32. The source and substrate of base driver transistor 32 is connected to negative voltage rail 14.

The output terminal of the base driver stage, at the connected drains of base driver transistor 32 and current source transistor 30, is connected to the base of NPN bipolar output transistor 34, which, along with N-channel MOS output driver transistor 36, comprise a typical output stage for an operational amplifier/driver. The collector of transistor 34 is connected to the positive voltage rail 12. The emitter of transistor 34 is connected to the drain of transistor 36. The gate of transistor 36 is connected to the gate of transistor 32 and is thus driven by the output of the differential input circuit. The connection between the emitter of NPN transistor 34 and the drain of driver transistor 36 forms the output of operational amplifier/driver circuit 10, to which output line 38 is connected.

When the circuit of FIG. 1 is integrated into a P-well CMOS integrated circuit, certain unwanted but inherent parasitic devices will exist by virtue of the structure necessary to fabricate such a circuit. In a P-well CMOS process, all N-channel transistors are constructed in P-wells. All P-wells are connected to the most negative voltage in this circuit, which, in the circuit of FIG. 1, is negative voltage rail 14. This situation is indicated in FIG. 1 by showing the substrates of N-channel transistors 24, 26, 32 and 36 connected to negative voltage rail 14. Similarly, all P-channel transistors are constructed in the N-type substrate, which is connected to the most positive voltage in this circuit, which, in FIG. 1, is positive voltage rail 12. Thus the substrates of P-channel devices 18, 20, 22, 28 and 30 are connected to the positive voltage rail. As will be appreciated by those skilled in the art, the polarities in an N-well CMOS process will be the opposite of those just stated.

The parasitic devices of interest with respect to the present invention are diodes 40 and 42 in FIG. 1. More particularly, the base-emitter junction 42 and the base-collector junction 40 of NPN output transistor 34 can be represented by back-to-back parasitic PN diodes 40 and 42, respectively. These diodes do not exist separately, but represent the effect of those two junctions of transistor 34. Parasitic diode 40 has as its anode the base P-well diffusion of NPN output transistor 34, and as its cathode, the N-type substrate which forms the collector of transistor 34. Parasitic PN diode 42 has, as its anode, the base P-well diffusion of NPN output transistor 34. Its cathode is the N-type diffusion inside the base P-well, which forms the emitter of NPN output transistor 34. Parasitic diode 42 is in fact the base-emitter junction of transistor 34.

The P-well CMOS technology which is used to fabricate the circuit of FIG. 1 also results in a more complex parasitic lateral/vertical NPN transistor structure 44 associated with N-channel MOS device 36. Its base is the P-well in which N-channel output driver transistor 36 is constructed. Its emitter is the N-type diffusion in that P-well which forms the drain of transistor 36. Its vertical collector is the N-type semiconductor substrate, and its lateral collector is the N-type diffusion forming the source of N-channel output transistor 36.

These parasitic devices come into play where the circuit of FIG. 1 is modified to include an output disable feature in accordance with this invention. Such a feature introduces the possibility that output line 38, when placed in its high impedance state and driven by an external voltage source, will be allowed to swing to voltages beyond the limits of the voltages on voltage rails 12 and 14. If such a condition occurs damage to the device may result. Those skilled in the art will appreciate that with an amplifier/driver of the type depicted in FIG. 1, fabricated in a typical P-well CMOS process, the output may not be driven more than a diode drop voltage below negative rail 14 without forward biasing the base-emitter junction of the parasitic NPN transistor 44.

Figure 2:
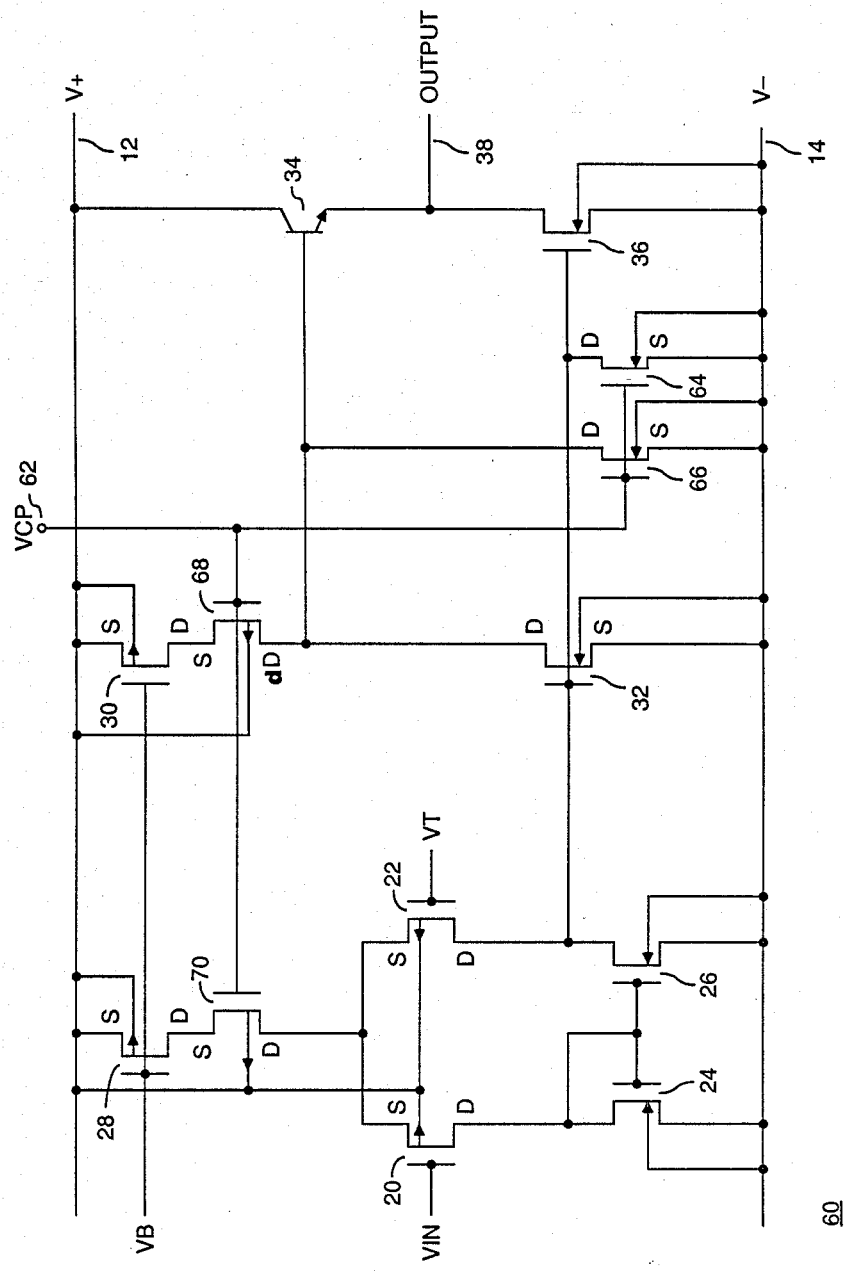
FIG. 2 shows a basic operational amplifier/driver circuit with additional components for placing the output of the amplifier/driver in a high impedance state, further illustrating the environment in which the present invention may function.

In FIG. 2, the basic amplifier/driver of FIG. 1 has been modified to allow output line 38 to be placed in a floating or high impedance state. In three state output amplifier/driver 60, the additional circuitry required to place the output state into a high impedance state is driven by a control signal VCP on line 62. If the voltage on line 62 is equal to the voltage on negative voltage rail 14, output line 38 is enabled. If the voltage on line 62 is equal to the voltage on positive voltage rail 12, output line 38 is disabled.

In order to disable output line 38, the gate of N-channel output driver transistor 36 is driven to negative voltage rail 14 by turning on N-channel output driver disable transistor 64, thus completely turning off transistor 36. Transistor 64 has its drain connected to the gate of transistor 36, its source and substrate connected to negative voltage rail 14 and its gate connected to VCP line 62. The base of output transistor 34 is also driven to the negative voltage rail 14 by N-channel output driver disable transistor 66, which has its drain connected to the base of output transistor 34, its source and substrate connected to negative voltage rail 14 and its gate connected to VCP line 62.

P-channel current source disable transistors 68 and 70 are also driven from VCP line 62, to which their gates are both connected. Transistor 68 is in series between P-channel current source transistor 30 and N-channel base driver transistor 32, and has its source connected to the drain of transistor 30. The drain of transistor 68 is connected to the drain of transistor 32 and the base of output transistor 34.

Transistor 70 is connected in series in between the differential input circuit (comprised of transistors 20 and 22) and the drain of transistor 28. Transistor 70 has its source connected to the drain of transistor 28 and its drain connected to the source of transistors 20 and 22.

Transistors 68 and 70 are turned on when VCP line 62 is connected to negative voltage rail 14, and are turned off when VCP line 62 is connected to positive voltage rail 12. The function of P-channel current source disable transistor 68 is to prevent the P-channel current source transistor 30 from driving the low on-resistance of transistor 66 when transistor 66 is turned on. Transistor 70 turns off the differential input circuit when the output line 38 is disabled. This serves to conserve current and also prevents the output of the differential input circuit from driving the low on-resistance of N-channel output drive disable transistor 64 when output line 38 is disabled.

When output line 38 has been disabled, it is in a high impedance state and can be driven to any voltage between the voltage on positive voltage rail 12 and negative voltage rail 14 without drawing any more than leakage currents from the output junctions. If no conditions were possible under which output line 38 could be driven beyond the voltages on voltage rails 12 and 14, there would be no problem. Some amplifier/drivers of the type shown in FIG. 2, however, employ a P-channel MOS transistor for output device 34 rather than an NPN bipolar transistor (with other well-known appropriate circuit changes). In that case, under certain real-world applications or under certain fault conditions, output line 38 cannot tolerate voltage swings more than a diode drop beyond voltage rails 12 and 14 in either direction without damaging the chip. Even in the circuit of FIG. 2 using a bipolar NPN output transistor 34, voltage swings more than a diode drop below that of rail 14 cannot be tolerated (although with the bipolar transistor, the output can go considerably more than a diode drop above rail 12).

Referring now to FIG. 1, as the output line 38 of the circuit is driven to a voltage below that of negative voltage rail 14, the parasitic NPN transistor 44 becomes important. It will be recalled that the base of parasitic transistor 44 is the P-well substrate of N-channel output driver transistor 36 at negative voltage rail 14, and its emitter is the drain diffusion of transistor 36.

When output line 38 is driven to a voltage below that on negative voltage rail 14, the PN junction comprising the base-emitter diode of parasitic NPN transistor 44 becomes forward biased. This condition can result in large currents which can destroy the device or cause SCR latch-up which also could destroy the device.

As the output line 38 is driven in the positive direction, the "LVCEO snapback" of the parasitic transistor 44 becomes one limiting factor when the output is about 17 volts above the negative voltage rail 14. The reverse breakdown voltage of the base-emitter junction of the NPN output transistor 34 is another limiting factor which comes into play as output line 38 is driven more positive than positive voltage rail 12 by an external source. When the reverse breakdown condition is reached, the base-collector junction of the output NPN transistor 34 becomes forward biased, thus clamping the base P-well to approximately the voltage on positive voltage rail 12. The emitter N+ diffusion of output transistor 34 can be driven above its P-well until the base-emitter reverse breakdown voltage is reached. This breakdown voltage is greater than the breakdown voltage of an N-channel drain diffusion to its P-well because, although the structure of the emitter region and the drain of an N-channel are identical, the thin oxide of the gate of an N-channel MOS transistor reduces the breakdown voltage.

In order to maintain high impedance with the output driven outside the range of the voltage appearing on voltage rails 12 and 14, the forward biasing of all parasitic PN junctions must be prevented. In particular, the junctions which must be controlled are the base-emitter junction of the NPN output transistor 34, shown as parasitic diode 42, and the drain diffusion of output N-channel transistor 36 to the negative voltage rail 14 (the base emitter junction of parasitic NPN transistor 44).

Figure 3A:
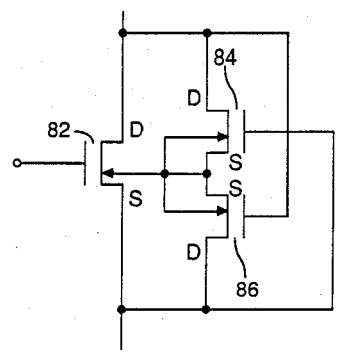
FIG. 3A is a schematic circuit diagram of an N-channel substrate control circuit of the present invention.
Figure 3B:
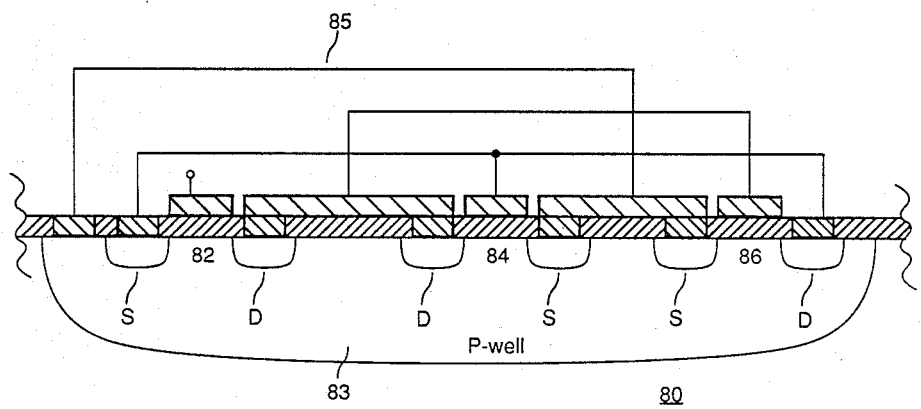
FIG. 3B is a cross-sectional view of the layout of the circuit of FIG. 3A.

The forward biasing of the sources or drains of the N-channel transistor may be prevented by employing the substrate control circuit 80 depicted in FIGS. 3A and 3B to replace the output N-channel transistor 36 in the amplifier/driver shown in FIG. 2. The substrate control circuit 80 of FIGS. 3A and 3B includes three N-channel transistors 82, 84, and 86, which, if desired, may all be fabricated in a common P-well 83 although separate wells connected together may be used. As shown in FIGS. 3A and 3B, the drain of N-channel controlled-substrate transistor 82 is connected to the drain of N-channel substrate-switching transistor 84. The source of transistor 84 is connected to the source of N-channel substrate-switching transistor 86, and the drain of transistor 86 is connected to the source of N-channel controlled-substrate transistor 82. The gate of transistor 84 is connected to the source of transistor 82, and the gate of transistor 86 is connected to the drain of N-channel controlled-substrate transistor 82. The P-well substrate 83 (FIG. 3B) for N-channel transistors 82, 84, and 86 is connected to the sources of N-channel transistors 84 and 86 with connection 85, illustrated by a wire in FIG. 3B, but which would be part of the conventional circuit metallization in the actual circuit layout.

The P-well substrate 83 for transistors 82, 84, and 86 is switched to the most negative terminal of N-channel controlled substrate transistor 82 by N-channel substrate-switching transistors 84 and 86. When the drain of transistor 82 is more positive than its source, transistor 86 is turned on and the P-well 83 is connected to the source of transistor 82.

In twin-tube CMOS technologies, becoming more prevelant in the art, both P- and N-wells are available on the chip. In this technology, it is possible to replace bipolar transistor 34 with an N-well substrate-control circuit of the type shown in FIG. 3. In that case, the substrate-control circuit shown in FIG. 3 is formed in an N-well substrate, and transistors 82, 84 and 86 are all P-channel, controlled-substrate transistors exactly as described in connection with FIG. 3, above, except for the polarity-type reversal. The operation of such an N-well substrate-control circuit is the same as described above, and serves to allow the voltage on output line 38 to go more than a diode drop above the voltage on positive rail 12. In this embodiment of the invention using twin-tub technology, substrate-control circuits 80 are used to replace both transistors 34 and 36 (shown in FIG. 2). If for some reason the voltage on output line 38 need only go more than a diode drop beyond one of rails 12 and 14 but not both, then only a single substrate control circuit 80 need be employed.

Figure 4:
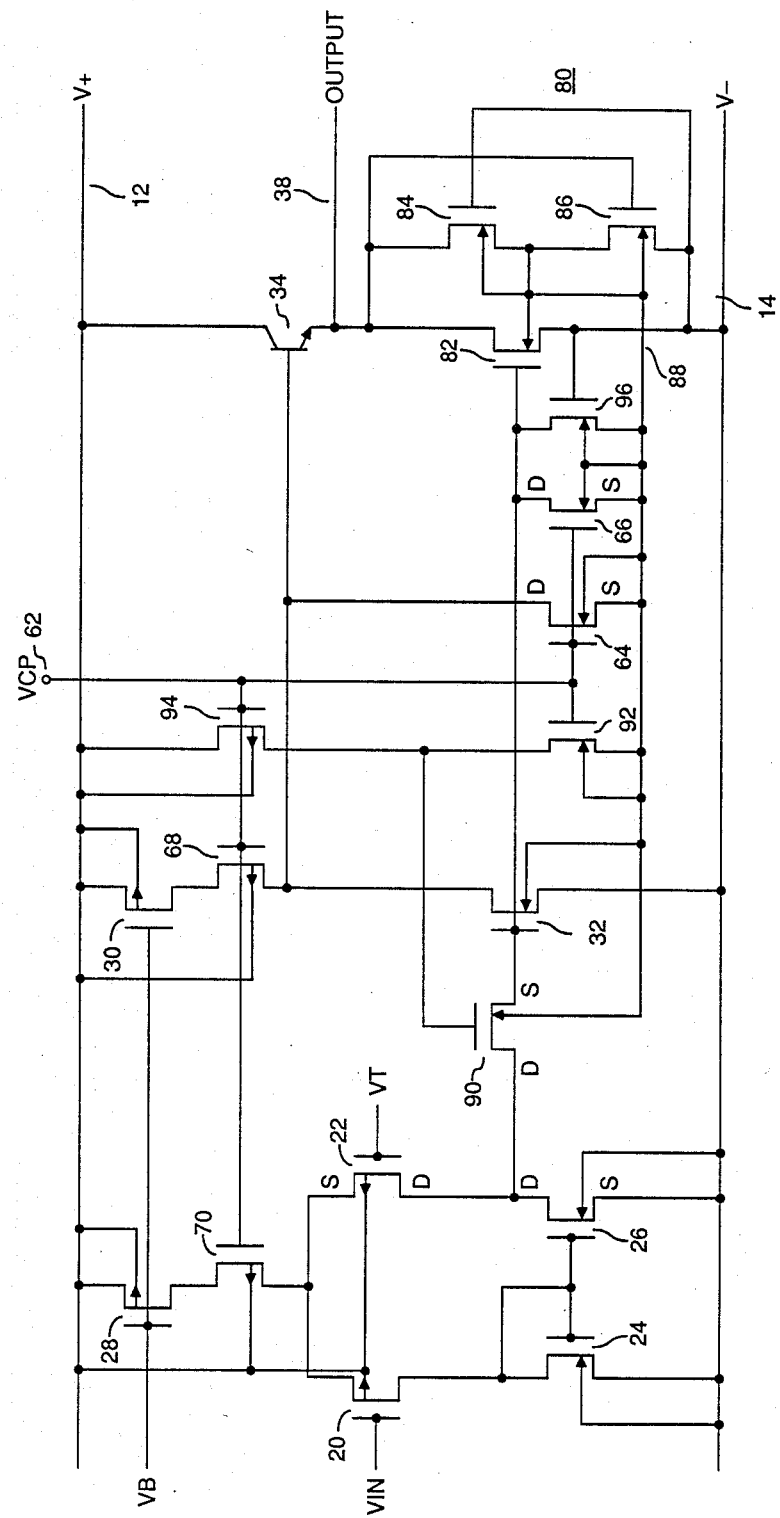
FIG. 4 is a schematic diagram of an operational amplifier/driver containing circuitry for placing the output in a high impedance state in accordance with a preferred embodiment of the present invention.

The mode of operation of the circuit of FIG. 3 can best be seen in the circuit of FIG. 4. Normal operation takes place with the output 38 enabled or with output 38 disabled, but held at a voltage between the voltages on voltage rails 12 and 14.

Still referring to FIG. 4, conversely, when the drain of transistor 82 is more negative than its source, transistor 86 is turned off and transistor 84 is turned on thus connecting the P-well substrate to the drain of transistor 82. This occurs when the output line 38 is disabled and the output is driven below negative voltage rail 14. The P-well substrate of transistor 82 is thus always at the most negative voltage, controlled to prevent any forward biasing of either source or drain junctions. This controlled-substrate output N-channel device 80 shown in FIGS. 3 and 4 is symmetrical. Either N+ diffusion could be the source or drain. The designations used here are for convenience. Normally the source of an N-channel transistor is the more negative terminal.

In the context of the present invention, the output circuit 80 is used, as shown in FIG. 4, as an output driver in place of N-channel output driver transistor 36 of FIG. 2. When the output line 38 (connected to the drain of transistor 82) is at a voltage between the voltage at negative voltage rail 14 and the voltage at positive voltage rail 12, the P-well containing controlled-substrate N-channel device 80 is driven to the voltage at negative voltage rail 12 by N-channel substrate-switching transistor 86.

As was in the case in the circuit of FIG. 2, N-channel output drive disable transistor 64 turns off the NPN output transistor 34, and N-channel output drive disable transistor 66 turns off N-channel controlled-substrate transistor 82, in response to a disable signal on VCP line 62. These devices are, however, now constructed in the controlled P-well substrate shown schematically as line 88 instead of a P-well substrate which lies at the negative voltage rail 14, as was the case in the circuit of FIG. 2. That is, the base of NPN output transistor 34 and the gate of N-channel output transistors 82 are pulled to the voltage appearing on line 88, to which the sources of N-channel transistor 64 and 66 are now connected.

N-channel transistor 90 has been added to the circuit in series with the output of the differential input circuit comprised of transistors 20 and 22. Its drain is connected to the output of the differential input circuit at the drain of P-channel transistor 22, its source is connected to the gates of N-channel base driver transistor 32 and N-channel output transistor 82. N-channel transistor 90 disconnects the drain of N-channel transistor 26 from the gates of N-channel transistors 32 and 82, thus allowing the gates of transistors 32 and 82, driven by transistor 66, to be pulled with the controlled-substrate to a voltage below that appearing on negative voltage rail 14 in order to keep output transistor 82 turned off. Without transistor 90, the gates of N-channel transistors 32 and 82 would be clamped to the voltage at negative voltage rail 14 by the parasitic diode at the drain of load transistor 26 in the differential input circuit.

N-channel transistor 92 and P-channel transistor 94 invert the control signal on VCP line 62 to provide the correct polarity to control transistor 90. When the output is enabled and is driven below the voltage appearing on negative voltage rail 14 (a fault condition), transistor 92 will turn on since its gate remains at the voltage appearing at negative voltage rail 14, which turns off transistor 90. This allows transistor 66 to turn off transistor 82 in controlled-substrate N-channel device 80, thus preventing excessive current from flowing.

Output drive disable N-channel transistor 96 performs the same function as output drive disable N-channel transistor 66 when no power is applied to the circuit of FIG. 4 and the output is driven below the voltage on negative voltage rail 14. Under these conditions transistor 96 is turned on because the controlled-substrate (line 88) is switched to the output by transistor 84, and the voltage on the gate of transistor 96 connected to negative voltage rail 14 is above the voltage at the controlled-substrate 88. Transistor 82 is thus kept turned off. Accordingly the circuit of FIG. 4 maintains a high impedance state at output line 38 when it is driven outside of the voltage range of voltage rails 14 by an external circuit.

The circuits of FIGS. 1, 3, and 4 will operate normally when the power supply voltage is less than the voltage at which "LVCEO snapback" occurs, as discussed above. For typical CMOS processes, the snapback voltage ranges from 12 to 20 volts. This phenomenon limits the range of application of these circuits.

Another aspect of a preferred embodiment of the present invention allows the output of an amplifier/driver to be driven to a voltage outside of the range of the power supply of the amplifier/driver circuit when placed in an high impedance state. It also allows the circuit to operate at higher supply voltages without experiencing the "LVCEO snapback" which would otherwise occur.

Figure 5:
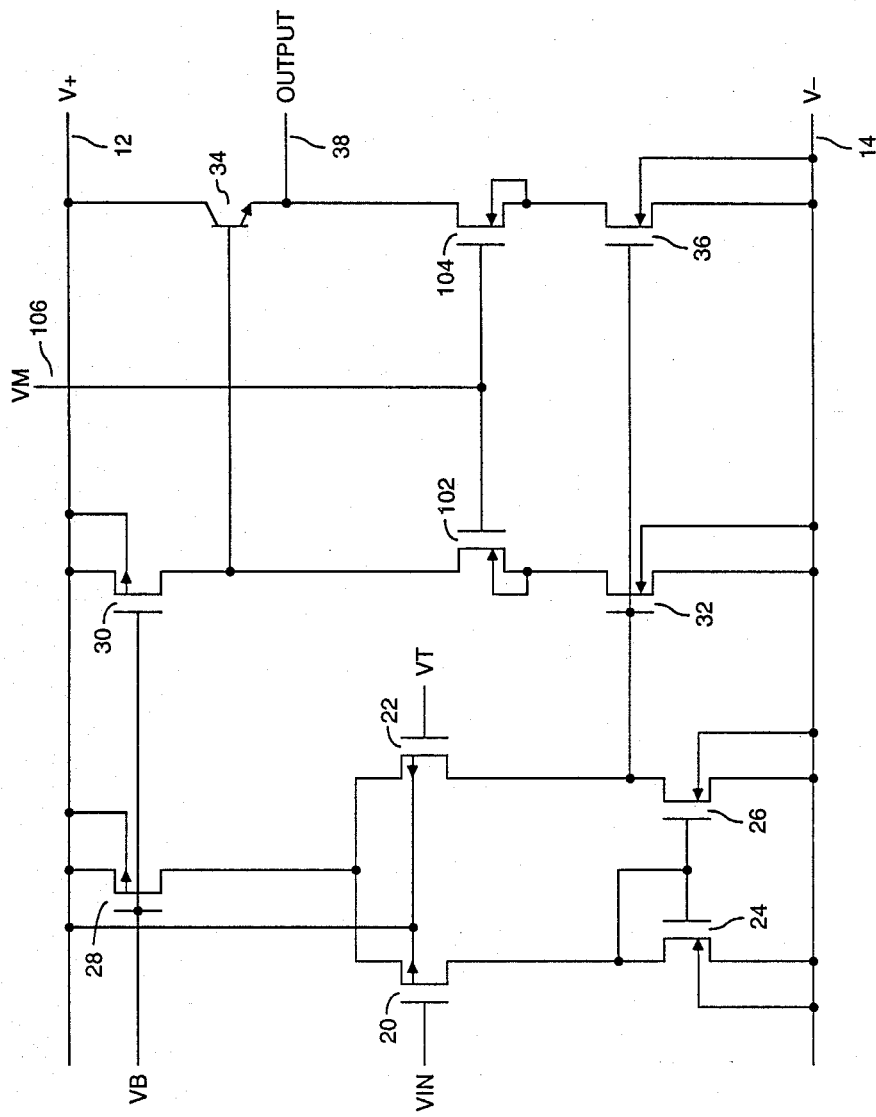
FIG. 5 is a schematic diagram of a basic operational amplifier/driver with cascode stage, illustrating the environment in which a preferred embodiment of the present invention may operated.
Figure 6:
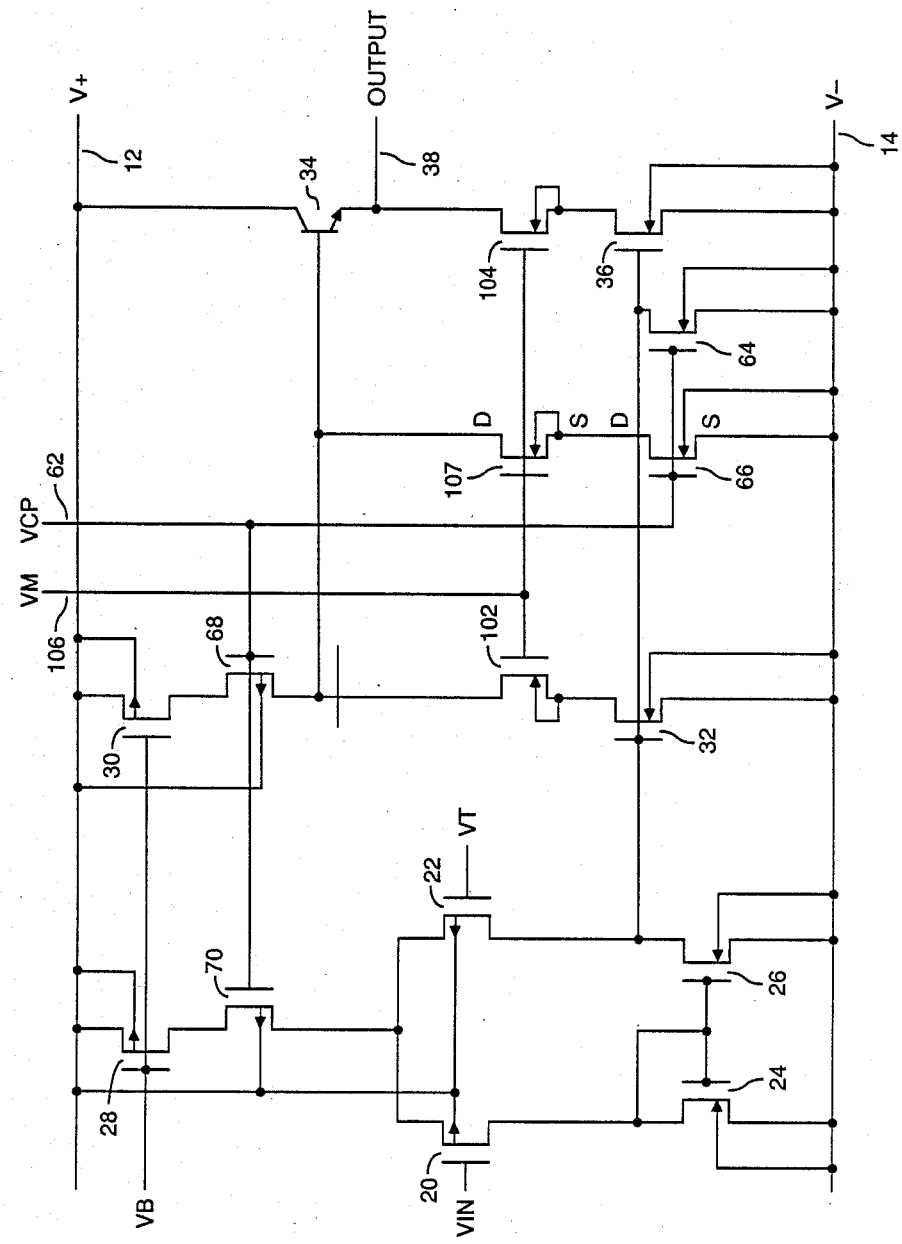
FIG. 6 is a schematic diagram of an operational amplifier/driver with cascode stages containing circuitry for placing its output in a high impedance state, further illustrating the environment in which the present invention may function.
Figure 7:
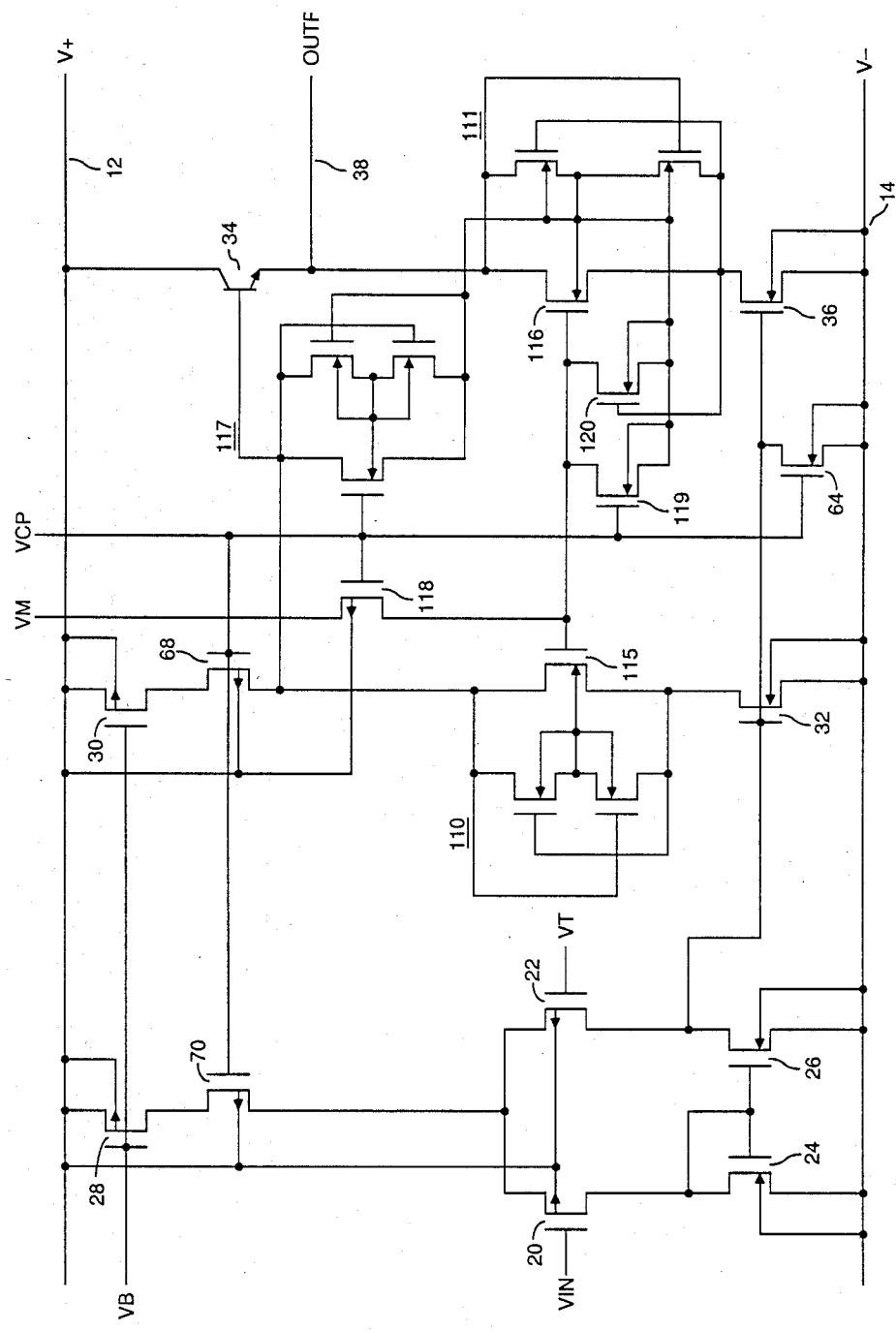
FIG. 7 is a schematic diagram of an operational amplifier/driver circuit having cascode states with circuitry for placing its output in a high impedance state according to a preferred embodiment of the present invention.

To more easily understand this aspect of the present invention, reference will be made to the environment in which this aspect of the present invention prevails. FIG. 5 shows the basic amplifier/driver of FIG. 1 with the addition of cascode stages. FIG. 6 shows the amplifier/driver of FIG. 5 with the additional circuitry required to place the output in a high impedance state. FIG. 7 shows the circuit of FIG. 6, modified according to the present invention, to prevent forward biasing of any junctions and thus allowing the output, when in a high impedance state, to be driven beyond the power supply voltages of the amplifier/driver.

Referring first to FIG. 5, the circuit shown is essentially identical to the circuit of FIG. 1 with the addition of N-channel base driver cascode transistor 102 and N-channel output driver cascode transistor 104. Gate-drive line 106 drives the gates of transistors 102 and 104. Cascode transistors 102 and 104 are each built in separate P-wells and are driven by a gate voltage VM on line 106, typically a few volts above ground, which in these CMOS circuits, is typically midway between the voltage on positive voltage rail 12 and the voltage on negative voltage rail 14. The voltage at output line 38, which can swing from the voltage at negative voltage rail 14 to the voltage at positive voltage rail 12, is shared across transistors 104 and 36 such that neither transistor 36 nor transistor 104 will have sufficient voltage impressed from drain to source to cause LVCEO snapback. This condition eliminates the LVCEO snapback limitation on the supply voltage for supply voltages up to twice the LVCEO snapback voltage.

In the circuit of FIG. 5, the base of NPN output transistor 34 can also swing between the voltage at negative voltage rail 14 and the voltage on positive voltage rail 12. Neither N-channel base driver transistor 32 nor N-channel base driver cascode transistor 102 will have sufficient voltage impressed on it from drain to source to cause LVCEO snapback for these devices. The result is that the previous power supply voltage range limitation of 12-20V is increased to 24-40V.

It is also possible to add additional cascode stages like the stage comprised of transistors 102 and 104 in FIG. 5. This would allow operation at even higher supply voltages, up to the breakdown voltage limitations of other circuit components.

The circuit of FIG. 6 shows the cascoded amplifier/driver circuit of FIG. 5 with additional circuitry required to place the output line 38 into a high impedance state. In the circuit of FIG. 6, like the circuit of FIG. 2, N-channel transistors 64 and 66 are driven by VCP line 62 to pull the gate of output driver N-channel transistor 36 and the base of NPN output transistor 34 to the voltage at negative voltage rail 14 to turn off both output devices when output line 38 is disabled. As described earlier, the additional N-channel output driver disable cascode transistor 107 is placed in the circuit to prevent the "LVCEO snapback" of N-channel transistor 66. N-channel output driver disable cascode transistor 107 has its drain connected to the base of output NPN transistor 34, its source and substrate connected to the drain of output driver disable transistor 66 and its gate connected to the VM line 106. When the output line 38 of the circuit of FIG. 6 is in a high impedance state, and it is driven below the voltage appearing on negative voltage rail 14, the drain-substrate diode of cascode transistor 104 will act like a diode in series with the emitter of the parasitic vertical NPN transistor 44 (shown in FIG. 1) associated with the N-channel output driver transistor 36. Very little current will thus be drawn while the output is less than two diode drops below the voltage appearing at negative voltage rail 14. However, the base of the transistor 34 is driven to the voltage appearing at negative voltage rail 14 through transistors 66 and 107. Output transistor 34 will thus turn on when output line 38 is one diode drop below the voltage on negative voltage rail 14.

In the positive direction, the "LVCEO snapback" breakdown voltage at the output is effectively doubled by the N-channel output driver cascode transistor 104. The circuit of FIG. 6 maintains a high impedance with the output line 38 at a voltage above the voltage appearing on positive voltage rail 12 until either the reverse breakdown voltage of the base-emitter junction of transistor 34 or twice the LVCEO breakdown of the N-channel transistors is reached. The base of transistor 34 is connected to the negative voltage rail 14 through transistors 66 and 107. Typical values for the base-emitter reverse breakdown are 30 volts and greater. For example, with the voltage at positive voltage rail 12 at +10 volts and the voltage at negative voltage rail 14 at −10 volts, the output line 38 will draw very little current while its voltage is less than 10 volts above the voltage on positive voltage rail 12.

Referring now to FIG. 7, a cascode amplifier/driver circuit which may have its output placed in a high impedance state and may be driven by voltages beyond the range of the voltages on voltage rails 12 and 14 is shown.

In the circuit of FIG. 7, the N-channel base driver cascode transistor 102 and the N-channel output driver cascode transistor 104 used in the circuit of FIGS. 5 or 6 have been replaced with controlled-substrate control circuits 110 and 111 of the type shown in FIG. 3. This eliminates the problem of forward biasing of any PN junctions at the output when output line 38 is driven beyond the ranges of voltage rails 12 and 14.

When the output of the circuit is disabled, the base of output NPN transistor 34 is now driven to the voltage on the controlled-substrate of transistor 116 (instead of V-rail 14 as was the case in the circuit shown in FIG. 6) to ensure that the output NPN transistor 34 remains off, especially when the output is below the voltage on rail 14. This is accomplished with another controlled-substrate N-channel circuit 117. The base driver cascode 102 (shown in FIGS. 5 and 6) must also be replaced by a controlled-substrate N-channel circuit 110 to allow the base of output NPN transistor 34 to go below the voltage on rail 14.

P-channel transistor 118 is added to disconnect VM from the gates of transistors 115 and 116. N-channel transistor 119 is added to drive the gates of transistors 115 and 116 to the voltage on the substrate of output transistor 116. This keeps both the cascode N-channel devices 115 and 116 turned off under all conditions while power is applied and the output is disabled. Transistor 120 performs the same function as transistor 119 when no power is applied and there is no control signal VCP. When no power is applied, the voltage V− and V+ on rails 12 and 14 will be at ground, and the output must maintain a high impedance when driven below ground under these conditions. The P-well of output cascode transistor 116 is controlled by circuit 111 such that the diodes at the output do not become forward biased, and transistor 120 ensures that cascode transistor 116 remains turned off.

While the invention has been described in connection with its preferred embodiments shown in FIGS. 1-7, those skilled in the art will be capable of making many modifications to this preferred embodiment without departing from the spirit and scope of the invention, as set forth in the claims which follow.

We claim:

1. An output circuit capable of producing an output signal which may be disabled, leaving the output terminal in a high impedance state capable of being driven externally to a voltage significantly outside the bounds of the output circuit power supply voltages, comprising:

two terminals coupled to a power supply capable of providing supply voltages;

a first MOS transistor having a substrate, a source terminal, a drain terminal and gate, one of said source and drain terminals being coupled to one power supply terminal;

a second transistor having three terminals including a control terminal and two other terminals, one of said two other terminals being coupled to the other of said source and drain terminals of said first MOS transistor and the other of said two other terminals being coupled to the other power supply terminal;

an output terminal coupled to the coupled terminals of said MOS and said second transistor;

means responsive to an external signal for rendering said output terminal in a high impedance state;

a substrate control circuit coupled to said substrate, source and drain terminals of said first MOS transistor, said substrate control circuit having a means for (1) detecting whether the voltage at said output terminal is within the voltage range of said power supply and (2) for controlling the voltage on said substrate of said first MOS transistor such that neither its source-substrate nor its drain-substrate junctions can become forward biased while at the same time providing a voltage capable of disabling both said second transistor and the MOS transistor upon receipt of said external signal.

2. The output circuit of claim 1 further characterized by said second transistor being bipolar and having a base electrode as its control terminal.

3. The output circuit of claim 1 further characterized by said second transistor being an MOS transistor having a gate electrode as its control terminal.

4. The output circuit of claim 1 further characterized by the addition of a gate control circuit coupled to the gate of said first MOS transistor, said gate control circuit connecting the gate of said first MOS transistor to its substrate upon receipt of said external signal, and said disabling voltage being the voltage applied to said substrate.

5. The output circuit of claim 4 further characterized by the addition of a means for coupling said gate control circuit to the control terminal of said second transistor for disabling said second transistor upon receipt of said external signal.

6. The output circuit of claim 1 further characterized by said substrate control circuit comprising second and third MOS transistors having their sources coupled together, each having its drain coupled to one of the source and drain terminals of said first MOS transistor, each having its substrate coupled to its source, and each having its gate coupled to the other of said source and drain terminals of said first MOS transistor.

7. An output circuit capable of producing an output signal which may be disabled, leaving the output terminal in a high impedance state capable of being driven externally to a voltage significantly outside the bounds of the output circuit power supply voltages, comprising:

two terminals coupled to a power supply capable of providing supply voltages;

a first MOS transistor having a substrate, a source terminal, a drain terminal and gate, one of said source and drain terminals being coupled to one power supply terminal;

a bipolar transistor having a base, an emitter and a collector, said emitter being coupled to the other of said source and drain terminals of said first MOS transistor and said collector being coupled to the other power supply terminal;

an output terminal coupled between said emitter of said bipolar transistor and said other of said source and drain terminals of said first MOS transistor;

means responsive to an external signal for rendering said output terminal in a high impedance state;

a substrate control circuit coupled to said substrate, source and drain terminals of said MOS transistor, said substrate control circuit having a means for (1) detecting whether the voltage at said output terminal is within the voltage range of said power supply and (2) for controlling the voltage on said substrate of said first MOS transistor such that neither its source-substrate nor its drain-substrate junctions can become forward biased while at the same time providing a voltage capable of disabling both the bipolar and the MOS transistor upon receipt of said external signal.

8. The output circuit of claim 7 further characterized by the addition of a gate control circuit coupled to the gate of said first MOS transistor, said gate control circuit connecting the gate of said first MOS transistor to its substrate upon receipt of said external signal, and said disabling voltage being the voltage applied to said substrate.

9. The output circuit of claim 8 further characterized by the addition of a means for coupling said gate control circuit to the base of said bipolar transistor for disabling said bipolar transistor upon receipt of said external signal.

10. The output circuit of claim 7 further characterized by said substrate control circuit comprising second and third MOS transistors having their sources coupled together, each having its drain coupled to one of the source and drain terminals of said first MOS transistor, each having its substrate coupled to its source, and each having its gate coupled to the other of said source and drain terminals of said first MOS transistor.

11. An output circuit capable of producing an output signal which may be disabled, leaving the output terminal in a high impedance state capable of being driven externally to a voltage significantly outside the bounds of the output circuit power supply, comprising:

two terminals coupled to a power supply capable of providing a supply voltage;

a cascode circuit including first and second MOS transistors, each having a substrate, a source terminal, a drain terminal and gate, one of said source and drain terminals of said first MOS transistor being coupled to one power supply terminal and the other of said source and drain terminals of said first MOS transistor being coupled to one of the source and drain terminals of said second MOS transistor;

a bipolar transistor having a base, an emitter and a collector, said emitter being coupled to the other of said source and drain terminals of said second MOS transistor and said collector being coupled to the other power supply terminal;

an output terminal coupled between said emitter of said bipolar transistor and said other of said source and drain terminals of said second MOS transistor;

means responsive to an external signal for rendering said output terminal in a high impedance state;

a substrate control circuit coupled to the substrate, source and drain terminals of said second MOS transistor, said substrate control circuit having a means for (1) detecting whether the voltage at said output terminal is within the voltage range of said power supply and (2) for controlling the voltage on said substrate of said second MOS transistor such that neither its source-substrate nor its drain-substrate junctions can become forward biased while at the same time providing a voltage capable of disabling the bipolar and said second MOS transistor upon receipt of said external signal.

12. The output circuit of claim 11 further characterized by the addition of a gate control circuit coupled to the gate of said first MOS transistor, said gate control circuit connecting the gate of said first MOS transistor to its substrate upon receipt of said external signal.

13. The output circuit of claim 12 further characterized by the addition of a gate control circuit coupled to the gate of said second MOS transistor, said gate control circuit connecting the gate of said second MOS transistor to its substrate upon receipt of said external signal, and said disabling voltage being the voltage applied to said substrate.

14. The output circuit of claim 13 further characterized by the addition of a means for coupling said gate control circuit to the base of said bipolar transistor for disabling said bipolar transistor upon receipt of said external signal.

* * * * *